(12) United States Patent
Kinch et al.

(10) Patent No.: US 9,112,098 B2
(45) Date of Patent: *Aug. 18, 2015

(54) MINORITY CARRIER BASED HGCDTE INFRARED DETECTORS AND ARRAYS

(71) Applicant: DRS RSTA, Inc., Dallas, TX (US)

(72) Inventors: Michael A. Kinch, Dallas, TX (US); Christopher A. Schaake, Dallas, TX (US)

(73) Assignee: DRS Network & Imaging Systems, LLC, Melbourne, FL (US)

( * ) Notice: Subject to any disclaimer, the term of this patent is extended or adjusted under 35 U.S.C. 154(b) by 18 days.

This patent is subject to a terminal disclaimer.

(21) Appl. No.: 14/167,967

(22) Filed: Jan. 29, 2014

(65) Prior Publication Data

US 2014/0147962 A1    May 29, 2014

Related U.S. Application Data

(62) Division of application No. 13/326,233, filed on Dec. 14, 2011, now Pat. No. 8,686,471.

(60) Provisional application No. 61/480,337, filed on Apr. 28, 2011.

(51) Int. Cl.
*H01L 21/00* (2006.01)
*H01L 31/18* (2006.01)
(Continued)

(52) U.S. Cl.
CPC ........ *H01L 31/1832* (2013.01); *H01L 27/1446* (2013.01); *H01L 27/14649* (2013.01);
(Continued)

(58) Field of Classification Search
USPC ........... 257/188, E31.053, E31.093, E27.122, 257/E25.004; 438/57
See application file for complete search history.

(56) References Cited

U.S. PATENT DOCUMENTS 4,568,960 A    2/1986    Petroff et al.
4,639,756 A *  1/1987    Rosbeck et al. ............... 257/442
(Continued)

FOREIGN PATENT DOCUMENTS

WO    2007-113821 A2    10/2007

OTHER PUBLICATIONS

International Search Report and Written Opinion mailed Apr. 2, 2012 in Int'l Patent Application No. PCT/US2012/031903, 12 pages.
(Continued)

*Primary Examiner* — Yu-Hsi D Sun
(74) *Attorney, Agent, or Firm* — Kilpatrick Townsend & Stockton LLP

(57) ABSTRACT

Disclosed are minority carrier based mercury-cadmium telluride (HgCdTe) infrared detectors and arrays, and methods of making, are disclosed. The constructions provided by the invention enable the detectors to be used at higher temperatures, and/or be implemented on less expensive semiconductor substrates to lower manufacturing costs. An exemplary embodiment a substrate, a bottom contact layer disposed on the substrate, a first mercury-cadmium telluride layer having a first bandgap energy value disposed on the bottom contact layer, a second mercury-cadmium telluride layer having a second bandgap energy value that is greater than the first bandgap energy value disposed on the first mercury-cadmium telluride layer, and a collector layer disposed on the second mercury-cadmium telluride layer, wherein the first and second mercury-cadmium telluride layers are each doped with an n-type dopant.

15 Claims, 9 Drawing Sheets

(51) Int. Cl.
  *H01L 31/0296* (2006.01)
  *H01L 31/0352* (2006.01)
  *H01L 31/101* (2006.01)
  *H01L 27/144* (2006.01)
  *H01L 27/146* (2006.01)

(52) U.S. Cl.
  CPC .. *H01L31/02966* (2013.01); *H01L 31/035281* (2013.01); *H01L 31/101* (2013.01); *Y02E 10/50* (2013.01)

(56) References Cited

U.S. PATENT DOCUMENTS

| | | |
|---|---|---|
| 4,679,063 A | 7/1987 | White |
| 5,187,378 A | 2/1993 | Takiguchi |
| 5,373,182 A | 12/1994 | Norton |
| 5,457,337 A | 10/1995 | Baron et al. |
| 5,518,934 A | 5/1996 | Forrest et al. |
| 5,742,089 A | 4/1998 | Rajavel et al. |
| 5,952,703 A * | 9/1999 | Murakami et al. ............ 257/442 |
| 5,998,809 A | 12/1999 | Chen et al. |
| 6,034,407 A * | 3/2000 | Tennant et al. ............... 257/440 |
| 6,559,471 B2 | 5/2003 | Finder et al. |
| 7,459,730 B1 | 12/2008 | Kinch |
| 7,504,672 B1 | 3/2009 | Kinch |
| 7,608,830 B1 | 10/2009 | Kinch |
| 7,687,871 B2 * | 3/2010 | Maimon ....................... 257/441 |
| 2002/0140012 A1 | 10/2002 | Droopad |
| 2007/0235758 A1 | 10/2007 | Klipstein |
| 2008/0111152 A1 | 5/2008 | Scott et al. |
| 2009/0127462 A1 | 5/2009 | Gunapala et al. |
| 2009/0256231 A1 | 10/2009 | Klipstein |
| 2011/0031401 A1 | 2/2011 | Mitra et al. |

OTHER PUBLICATIONS

Notice of Allowance mailed Oct. 29, 2013 in U.S. Appl. No. 13/326,233, 10 pages.

\* cited by examiner

MINORITY CARRIER BASED HGCDTE INFRARED DETECTORS AND ARRAYS

CROSS-REFERENCES TO RELATED APPLICATIONS

This application is a divisional of U.S. patent application Ser. No. 13/326,233 filed Dec. 14, 2011, which claims priority to U.S. Provisional Patent Application No. 61/480,337 filed Apr. 28, 2011, the disclosures of which are hereby incorporated in their entirety by reference for all purposes.

BACKGROUND OF THE INVENTION

Mercury-cadmium telluride detectors (HgCdTe) are widely used to detect infrared radiation, typically being arranged in two-dimensional arrays for optical imaging applications. However, HgCdTe is expensive, and the detectors have to be cooled to low temperatures to reduce image noise and to provide good image contrast and quality. These are two factors that limit the applications of these detectors.

BRIEF SUMMARY OF THE INVENTION

Minority carrier based mercury-cadmium telluride (HgCdTe) infrared detectors and arrays, and methods of making, are disclosed. The constructions provided by the invention enable the detectors to be used at higher temperatures, and/or be implemented on less expensive semiconductor substrates to lower manufacturing costs.

One exemplary embodiment of the invention is directed to an infrared detector comprising a substrate, a bottom contact layer disposed on the substrate, and a first mercury-cadmium telluride layer having a first major surface disposed on the bottom contact layer, a second major surface parallel to its first major surface, and a first bandgap energy value, the first mercury-cadmium telluride layer being doped with an n-type dopant. The exemplary infrared detector further comprises a second mercury-cadmium telluride layer having a first major surface disposed on the second major surface of the first mercury-cadmium telluride layer, a second major surface parallel to its first major surface, and a second bandgap energy value that is greater than the first bandgap energy value, the second mercury-cadmium telluride layer being doped with an n-type dopant. The exemplary infrared detector further comprises a collector layer having a first major surface disposed on the second major surface of the second mercury-cadmium telluride layer, a second major surface parallel to its first major surface.

Another exemplary embodiment of the invention is directed to a method of making an infrared detector broadly comprising: forming a bottom contact layer on a substrate; forming a first mercury-cadmium telluride layer on the contact layer, the first mercury-cadmium telluride layer having a first major surface disposed on the bottom contact layer, a second major surface parallel to its first major surface, and a first bandgap energy value, the first mercury-cadmium telluride layer being doped with an n-type dopant; forming a second mercury-cadmium telluride layer on the first mercury-cadmium telluride layer, the second mercury-cadmium telluride layer having a first major surface disposed on the second major surface of the first mercury-cadmium telluride layer, a second major surface parallel to its first major surface, and a second bandgap energy value that is greater than the first bandgap energy value, the second mercury-cadmium telluride layer being doped with an n-type dopant; and forming a collector layer on the second mercury-cadmium telluride layer, the contact layer having a first major surface disposed on the second major surface of the second mercury-cadmium telluride layer, a second major surface parallel to its first major surface. Additional method embodiments further comprise pattern etching portions of at least the contact layer and second mercury-cadmium telluride layer to device two or more detector elements with side walls; and forming a passivation layer on the sidewalls.

These and other embodiments of the invention are described in detail in the Detailed Description with reference to the Figures.

DETAILED DESCRIPTION OF THE INVENTION

Figure 1:
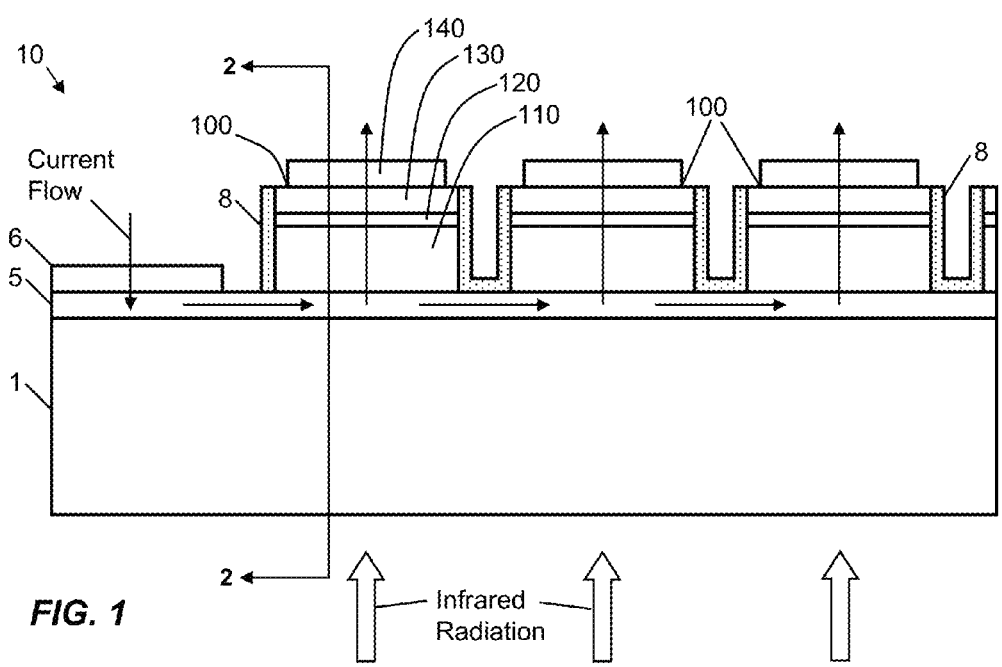
FIG. 1 shows a cross-section of a first exemplary infrared detector array of detectors according to the invention.

The techniques in accordance with the present invention will be described more fully hereinafter with reference to the accompanying drawings, in which exemplary embodiments of the invention are shown. The invention may, however, be embodied in different forms and should not be construed as limited to the embodiments set forth herein. Rather, these embodiments are provided so that this disclosure is thorough and complete and fully conveys the scope of the invention to one skilled in the art. In the drawings, the thicknesses of layers and regions may be exaggerated for clarity. The same reference numerals are used to denote the same elements throughout the specification.

FIG. 1 shows a cross-section of a first exemplary infrared detector array 10 according to the invention. Array 10 comprises a substrate 1, a bottom electrical contact layer 5, a plurality of delineated infrared detectors 100 disposed over bottom electrical contact layer 5, a conductive pad 6 disposed on contact layer 5 and electrically coupled thereto, and an electrically insulating passivation layer 8 disposed on the side walls of the delineated detectors 100, and preferably the exposed portions of bottom contact layer 5. The arrangement of detectors 100 in array 10 is preferably two dimensional. Each detector 100 comprises the following n-type (n-doped) mercury-cadmium telluride semiconductor layers: an absorber layer 110 having a top major surface and a bottom major surface disposed on the top major surface of bottom contact layer 5, a barrier layer 120 having a top major surface and a bottom major surface disposed directly on absorber layer 110, and a collector layer 130 having a top major surface and a bottom major surface disposed directly on a barrier layer 120. Each detector 100 further comprises a top collector pad 140 disposed on the top major surface of collector layer 130. Passivation layer 8 may comprise an oxide layer, such as formed by the oxidation of the mercury-cadmium telluride material. A conventional read-out chip (not shown) may be disposed in an opposite facing relationship with the top surface of array 10. The read-out chip has a set of interconnect pads that match the positions of the array's connection pads 6 and 140, and may be attached thereto by a set of solder bumps. The read-out chip applies a voltage between each collector pad 140 and collector pad 6, and senses a current that is generated in relation to the amount of infrared radiation absorbed by the detector 110 of the pad 140.

Absorber layer 110 is configured to absorb infrared radiation in a desired band of wavelengths and generate electron-hole pairs in relation to (e.g., in proportion to) the amount of infrared radiation absorbed. Absorber layer 110 typically has a bandgap in the range of 0.24 eV to 0.27 eV for mid-wave IR (MWIR) detectors, and 0.12 eV to 0.155 eV for long wave IR (LWIR) detectors. Substrate 1 preferably comprises a semiconductor that has a larger bandgap energy than absorber layer 110 so as to allow the infrared radiation to reach layer 110 through substrate 1 with the least amount of attenuation. Substrate 1 may comprise cadmium telluride (CdTe) or cadmium-zinc telluride (CdZnTe) substrates, each of which has bandgap energy values of more than 1.4 eV. As one of many novel aspects of the present application, substrate 1 may also comprise silicon, which has a bandgap energy of approximately 1.1 eV, or alternatively, gallium arsenide which has a bandgap of approximately 1.5 eV. The absorber layer 110 is doped with n-type doping, which significantly reduces the concentration of holes that the intrinsic thermal generation process can generate, and thereby enables the concentration of holes generated by the absorption of infrared radiation to substantially determine the hole concentration in layer 110. A negative voltage, relative to bottom contact layer 5, is applied to collector layer 130 via top collector pad 140, to generate a current that is related to the concentration of holes generated in absorber layer 110. This current flows in the vertical direction, perpendicular to the major surfaces of each of layers 110, 120, and 130. Contact layer 5 may comprise mercury-cadmium telluride (HgCdTe) or a gradation of cadmium telluride (CdTe) to mercury-cadmium telluride, where the mole fraction of telluride in both cases is sufficiently high to provide the contact layer with a wider bandgap than that of absorber layer 110. Contact layer 5 may be thinner than absorber layer 110, and preferably has a higher n-type doping concentration than that of absorber layer 110 and that of the substrate. For example, contact layer 5 may have an n-type doping concentration of $1 \times 10^{17}$ dopant atoms per cubic centimeter ($cm^{-3}$) or more.

Barrier layer 120 is configured to allow the flow of holes toward collector layer 130, but to substantially block the flow of mobile electrons that are present in collector layer 130 from flowing to absorber layer 110. The blocking action substantially prevents a drift current component of electrons from adding to the current generated by the application of voltage to collector layer 130, thereby allowing the generated current to be substantially representative of the holes that are generated in absorber layer 110 and swept across the barrier layer by the applied voltage. The delineated and passivated side walls 8, of the absorber layer 110, serve to prevent the diffusion of minority carrier holes into adjacent detectors, thus resulting in a reduction in detector cross-talk, and an enhancement in modulation transfer function of the individual detectors elements 100.

Collector layer 130 is configured to establish, along with barrier layer 120, a substantial barrier to electron flow toward absorber layer 110 by providing a low electron energy level (e.g., low conduction band energy) relative to barrier layer 120. Collector layer 130 may also be configured to combine the received holes with a source of electrons if the received holes cannot be efficiently collected by top collector pad 140. Collector layer 130 may comprise a semiconductor such as mercury-cadmium telluride (HgCdTe). It may also comprise a semi-metal, such as mercury telluride (HgTe), which has a conduction band that overlaps with the valence band. Layers 110, 120, and 130 may be implemented by layers of mercury-cadmium telluride ($Hg_{1-x}Cd_xTe$) with varying mole fractions (x) of cadmium relative to mercury that are selected to configure the layers for their respective purposes. This selection is described below.

Collector pad 140 is configured to make good electrical connection with collector layer 130, and to provide a reliable and sturdy metallurgical connection to both collector layer 130 and a corresponding interconnect pad on a conventional read-out chip (ROIC), not shown in FIG. 1. It may comprise a plurality of layers of different metals selected for the adhesive qualities, as is known in the art.

Figure 2A:
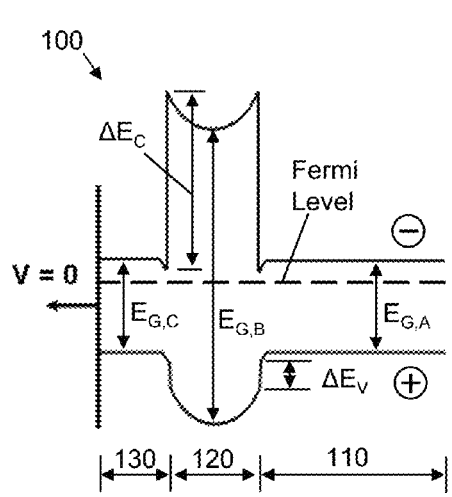
FIGS. 2A and 2B show band diagrams of an exemplary detector under no bias and under bias, respectively.
Figure 2B:
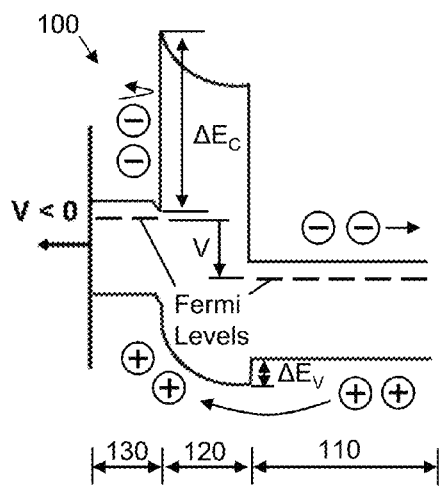

FIGS. 2A and 2B show the band diagrams of detector 100 under no bias (FIG. 2A) and under a negative bias applied to collector layer 130 (FIG. 2B). The band diagrams are drawn along the line 2-2 shown in FIG. 1, and pass vertically through detector 100, perpendicular to the major surfaces of layers 110, 120, and 130, and substantially parallel with the current flow through the detector. For the purposes of illustration, and without loss of generality, the example shown in FIGS. 2A and 2B is drawn with absorber layer 110 and collector layer 130 having the same semiconductor composition and same bandgap energies $E_{G,A}=E_{G,C}$, and with the barrier layer 120 having a different semiconductor composition that provides a larger bandgap energy $E_{G,B}$. The difference in bandgap energies provides an upward energy step of $\Delta E_C$ in the conduction band when moving electrons from collector layer 110 to barrier layer 120, thus providing a barrier to electron transport. (In band diagrams such as those shown in FIGS. 2A and 2B, electrons prefer to move lower energy levels ("roll down"), while holes prefer to move to higher energy levels ("bubble up").) The difference in bandgap energies also provides a downward energy step of $\Delta E_V$ in the valence band when moving a hole from absorber layer 110 to barrier layer 120, which provides a barrier to hole transport. In the $Hg_{1-x}Cd_xTe$ semiconductor system, over the mole fraction range of 0.13 to 0.60 in cadmium, approximately 32.3% of the difference in bandgap energies between two adjacent layers of different cadmium composition (x) occurs in the valence band energy step $\Delta E_V$, and approximately 67.7% of the difference in bandgap energies occurs in the conduction band energy step $\Delta E_C$. Thus, the introduction of the wider bandgap barrier layer 120 using $Hg_{1-x}Cd_xTe$ semiconductor materials provides a larger barrier to electron transport than to hole transport because of this unequal splitting of the step in bandgap energies.

N-type doping is present in each of layers 110, 120, and 130. Referring to FIG. 2A where no bias voltage is applied, the Fermi level is below the conduction bands of the smaller bandgap layers 110 and 130, and is closer to the conduction bands than the valence bands. Mobile electrons in barrier layer 120 prefer to move to the lower energy levels provided by the adjacent layers 110 and 130, leaving the barrier layer substantially depleted of mobile electrons and creating a depletion region in the barrier layer 120. The positive donor charge of the ionized dopant in barrier layer 120 causes the conduction and valence bands to bend in a concave upwards manner. The electrons displaced from the barrier layer 120 accumulate in the layers 110 and 130 in respective accumulation regions that are immediately adjacent to barrier layer 120. The conduction and valence bands are bent in a half downward concave manner in these accumulation regions. The band bending in the accumulation regions and in the depletion region of layer 120 effectively increases the barrier to the flow of holes from layer 110 to layer 130 to a value greater than $\Delta E_V$. By applying a negative voltage to collector layer 130 with respect to absorption layer 110, this barrier to the flow of holes can be reduced to a value of $\Delta E_V$. Under this bias, the accumulation region between layers 110 and 120 is eliminated, the band bending in the valence band of barrier layer 120 is adjusted so that the lowest energy of the layer's valence band occurs next to absorption layer 110, and the effective barrier width of barrier layer 120 is reduced. Because barrier layer 120 is depleted, most of the applied voltage is dropped across it, and most of the electric fields generated by the applied bias occur in it; relatively small electric fields occur in layers 110 and 130 to support the overall current flow in the device. Under these bias conditions, holes generated in absorption layer 110 by the absorption of infrared radiation diffuse toward barrier layer 120, enter into barrier layer 120 over the $\Delta E_V$ step barrier by a thermionic emission mechanism, and are swept across barrier layer 120 to collector layer 130 by the electric fields in barrier layer 120. In collector layer 130, these holes mainly diffuse to top collector pad 140 to complete the first half of the external electrical circuit. Some of the holes may recombine with the mobile electrons in collector layer 130, which are resupplied by electrons from collector pad 140. The resupplied electrons also aid in completing the first half of the external electrical circuit. The electrons in collector layer 130 are substantially prevented from entering barrier layer 120 by the relatively high $\Delta E_C$ step barrier. Electrons generated in absorption layer 110 by the absorption of infrared radiation diffuse and drift toward bottom contact layer 5, and are absorbed there to complete the other half of the external electrical circuit.

For the case of the collector and absorber layers having the same bandgap energy value, the current density $J_{teh}$ caused by the thermionic emission of holes from absorber layer 110 to collector layer 130 is given by the below equations (1) and (2), and the current density $J_{tee}$ caused by the thermionic emission of electrons from collector layer 130 to absorber layer 110 is given by the below equation (3):

$$J_{teh} = \frac{qN_{min}}{\left(\frac{1}{v_b}+\frac{\tau}{t}\right)} = \frac{q((n_i^2/N_d)+(\eta\Phi_B\tau/t))}{\left(\frac{1}{v_b}+\frac{\tau}{t}\right)}\left[\exp\left(\frac{qV}{kT}\right)-1\right], \quad (1)$$

$$v_b = v_{th}\exp\left(\frac{-q\Delta E_v}{kT}\right) \quad (2)$$

$$J_{tee} = 120\left(\frac{m_e^*}{m_o}\right)T^2\exp\left(-\frac{q\Delta E_c}{kT}\right)\left[\exp\left(\frac{qV}{kT}\right)-1\right] \quad (3)$$

where $N_{min}=(n_i^2/N_d+\eta\Phi_B\tau/t)$ is the minority carrier hole concentration in the absorber of thickness t due to thermal and background flux generation, $v_{th}$ is the thermal velocity of the hole, $v_{th}=(kT/2\pi m_h^*)^{1/2}$, $m_h^*$ and $m_e^*$ are the hole and electron effective masses in the absorber/collector layers relative to the electron rest mass $m_o$, q is the electron charge, k is the Boltzmann constant, T is the temperature, V is the applied voltage, $\Delta E_V$ is the step barrier in the valence band, $\Delta E_C$ is the step barrier in the conduction band, $\Phi_B$ is the background infrared photon flux density of the infrared radiation, $\eta$ is the quantum efficiency for converting infrared photons into electron-hole pairs, $\tau$ is minority carrier (hole) lifetime in the absorber layer, and exp(*) is the mathematic exponent function. The quantity $v_b$ in equation (2) may be viewed an a minority carrier (e.g., hole) barrier velocity. For HgCdTe material, $m_h^*=0.55\ m_o$, across the typically-used cadmium composition range, and $m_e^*=7\times10^{-2}E_g m_o$. The above current densities are plotted as a function of the bandgap energy value of barrier layer 120 in FIG. 3 for the case of a detector 100 with an absorber bandgap energy $E_{G,A}=0.25$ eV (corresponding to a 5 um cutoff wavelength), and operated at 150° K, and with an applied bias V that causes the absorber layer to have flat conduction and valence bands (as shown in FIG. 2B). FIG. 4 plots these current densities for the same detector 100 at 200° K. The flat band condition can be achieved with a bias potential of around 80 mV for the case of barrier layer 120 having an n-type doping level of $1\times10^{16}$ cm$^{-3}$ and a thickness of 1000 Angstroms. In both of FIGS. 3 and 4, a background infrared flux density is assumed (notated as "F/3 Flux" and explained below in greater detail), which gives rise to the flat top portions of the hole current densities $J_{teh}$. As the barrier bandgap energy increases in value, the hole current densities $J_{teh}$ decline in an exponential manner due the $\Delta Ev$ step barrier becoming more prominent due to the increase of $\Delta Ev$ with the barrier bandgap energy (notated as the $\Delta Ev$ Step Barrier Limit Regime in the figures).

For proper detector operation, $v_b>>t/\tau$, in Equation (1). In this way, the current generated by the detector is limited by the holes generated in absorber layer 110, not by the emission of holes over the $\Delta E_V$ step barrier. In order to increase picture contrast and to reduce the effects of noise, the electron emission current density $J_{tee}$ should be significantly less than the maximum expected hole current density, and should further be lower than the minimum expected hole current density for the minimum expected amount of infrared radiation to be detected by the system. The minimum expected amount of infrared radiation is typically the background thermal radiation of the image field, as transmitted to detector 100 by the optical system that is placed between detector 100 and the image field. The magnitude of the background thermal radiation that reaches detector 100 scales with the F-number of the optical system, where the F-number is the system's optical focal length divided by the system's effective aperture diameter. For the discussion of FIGS. 3 and 4, it is assumed that detector 100 is placed in an optical system that has an optical F-number of 3 (notated as "F/3"), and the minimum expected amount of hole current density to be generated in detector 100 by the background thermal radiation is denoted by the horizontal segment of the line labeled as "F/3 flux" in the figures. Selecting a bandgap value of 0.75 eV to 0.8 eV for barrier layer 120 ensures that the unwanted electron emission current density $J_{tee}$ is at least 10 times less than minimum expected hole current density for both temperatures. While keeping this bandgap energy value for barrier layer 120 at 0.75 eV to 0.8 eV ensures that the hole current density is dominated by the hole generation rate in the absorber volume for both temperatures. For an absorber bandgap energy value $E_{G,A}=0.25$ eV (corresponding to a 5 μm cutoff wavelength at 150° K), a barrier bandgap energy value $E_{G,A}$ of 0.8 eV means that the $\Delta E_V$ step barrier will be approximately 0.177 eV.

Figure 5:
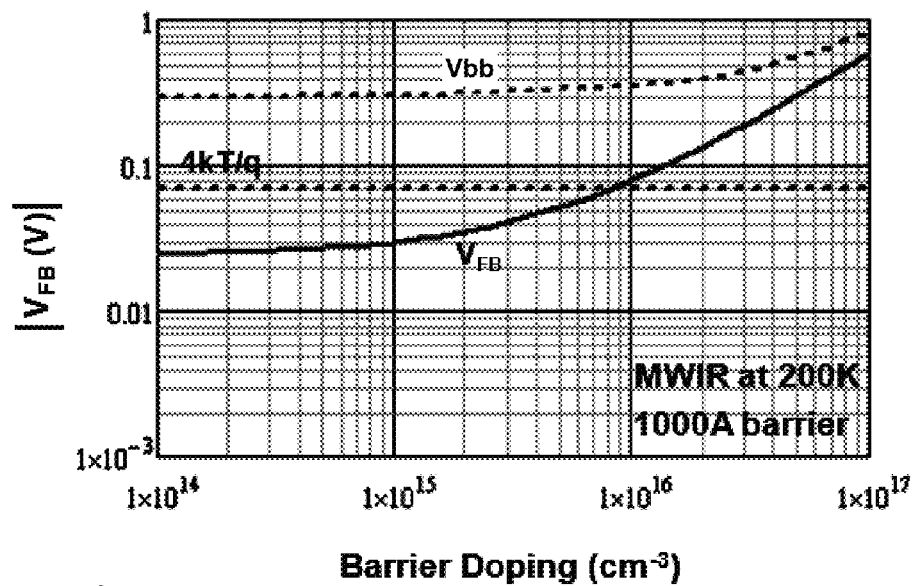
FIG. 5 plots the voltage to achieve the flat band condition in the absorber layer as a function of dopant concentration for an exemplary MWIR detector according to the present invention at an operating temperature of 200° K.

For identical bandgap energies in absorber layer 110 and collector layer 130, the bias voltage $V_{FB}$ to induce a flat band condition at the barrier-absorber interface is equal to the voltage needed to accommodate half of the charge in the barrier layer, and is approximately given by $V_{FB} \sim [W_B^2 q N_B / 2\in_B \in_o + (2kT/q)\ln(2)]$ where $W_B$ is the barrier width, $N_B$ the barrier doping level, $\in_o$ is the permitivity (dielectric constant) in vacuum ($8.854\times10^{-14}$ F/cm), and $\in_B$ is the relative permittivity of the barrier layer with respect to vacuum permitivity (generally ranging between 18 and 20). The dependence of $V_{FB}$ on barrier doping for a MWIR absorber layer at 200° K is shown in FIG. 5, for a 1000 Å thickness for barrier layer 120. FIG. 5 shows the magnitude of the flat band voltage, which is actually negative with respect to bottom contact layer 5. For example, for a barrier doped n-type at $1\times10^{16}$ cm$^{-3}$, the magnitude of flat band voltage $V_{FB}$ is approximately 80 mV. The magnitude of the flat band voltage $V_{FB}$ should be larger than a few (kT/q), where T is the operating temperature, and k is the Boltzmann constant, so that adequate thermionic emission is obtained over the valence band offset, to support the minority carrier hole flow. A minimum level of approximately 4 kT/q is generally sufficient, and this level is shown in FIG. 5. Increasing the magnitude of the applied voltage beyond that of $V_{FB}$ will create a depletion region in absorber layer 110, in the location next to barrier layer 120. This depletion region will move toward bottom contact layer 5 as the magnitude of the voltage is increased (more negative voltage V applied). As described below in greater detail, the nature of various parasitic currents, called "dark currents," will vary with the size of the depletion layer. For some operating conditions and detector designs, it will be advantageous to keep the magnitude of the applied voltage V near that of $V_{FB}$. For other operating conditions and detector designs, it will be advantageous to keep the magnitude of the applied voltage V above that of $V_{FB}$ (e.g., more negative) so as to generate a depletion region.

All real world semiconductor devices have crystal defects, such as misfit and threading dislocations, present in their semiconductor layers, and the density of these defects generally depends on the method used to grow or form the layers, and the conditions under which the layers are grown or formed. For example, HgCdTe material grown epitaxially on CdTe or CdZnTe substrates can have defect densities on the order of approximately $2\times10^4$ cm$^{-2}$ to $1\times10^6$ cm$^{-2}$ (defects per square centimeter of surface area). Some of these defects propagate in the direction vertical to the surface layers as the HgCdTe material is grown, which is the direction that is parallel to the flow of current in vertically-oriented devices such as detector 100. Because the semiconductor band structure is distorted in such a defect and the volume immediately surrounding it, the defect can allow parasitic currents to flow along its dimensions. Dislocations in semiconductors are typically modeled as highly doped n-type donor pipes. As such, undesired parasitic electron currents can be conducted through the crystal defects present in detector 100. However, the presence of the barrier layer 120 will inhibit the flow of majority carrier electrons from the absorber 110 to the collector 130, thus potentially eliminating these undesirable parasitic currents. It should be pointed out that other excess currents, such as tunnel currents, can flow when the magnitude of the applied bias V is sufficient to cause the energy level of absorber 110's valence band, as measured at the interface between layers 110 and 120, to rise above the energy level of the absorber 110's conduction band, as measured at the interface with bottom contact layer 5. The magnitude of the applied voltage V needed to cause this condition is illustrated as voltage Vbb in FIG. 5.

Growing HgCdTe material on materials that are less expensive than CdZnTe would be desirable since these materials are relatively expensive. Such less expensive materials include silicon (Si), indium antimonide (InSb), gallium arsenide (GaAs), and germanium (Ge). However, growing HgCdTe material on materials that are different from CdZnTe results in levels of crystal defects in the HgCdTe material that are significantly higher than $1\times10^6$ cm$^{-2}$ (defects per square centimeter of surface area), such as $1\times10^7$ cm$^{-2}$ and higher. Such levels of defects are sufficient to render conventional detector devices severely degraded or inoperable for their intended purpose. These defects are mainly due to the mismatch in the lattice constants (e.g., the spacing of the atoms in the material) between HgCdTe and these cheaper substrate materials. As an inventive aspect of the present application, by constructing a HgCdTe implementation of detector 100 so that the magnitude of the applied voltage V is between the magnitudes of $V_{FB}$ and Vbb shown in FIG. 5, an acceptably functional detector 100 can be constructed of HgCeTe material that is grown on a substrate material that is different from CdZnTe, such as less expensive materials like Si, InSb, GaAs, and Ge. The high density of crystal defects found in HgCdTe material grown on these less expensive substrate materials has prevented the successful implementation conventional diode-based MWIR and LWIR detectors on these less expensive substrate materials. However, the structure of detector 100 enables it to be constructed from HgCdTe materials grown by MBE on these less expensive substrate materials, thereby enabling large arrays 10 of detectors 100 to be constructed at relatively low cost. In these embodiments, absorber layer 110 may have a crystal defect density of $1\times10^6$ cm$^{-2}$ or more, without degrading the performance of detector 100. Tolerable crystal defect densities of $1\times10^7$ cm$^{-2}$ or more are possible.

Figure 3:
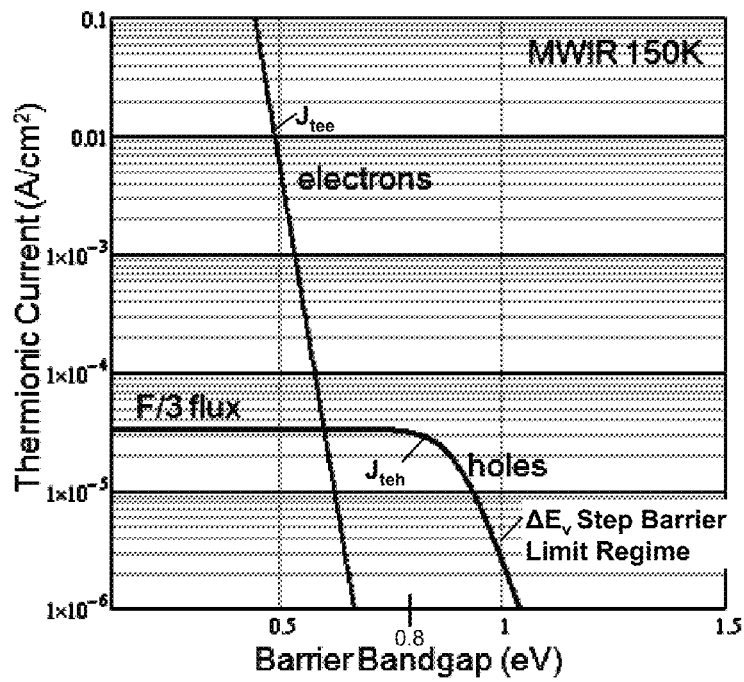
FIGS. 3 and 4 plot the electron and hole emission current densities in an exemplary MWIR detector according to the present invention as a function of bandgap energy value of the barrier layer at operating temperatures of 150° K and 200° K, respectively.
Figure 4:
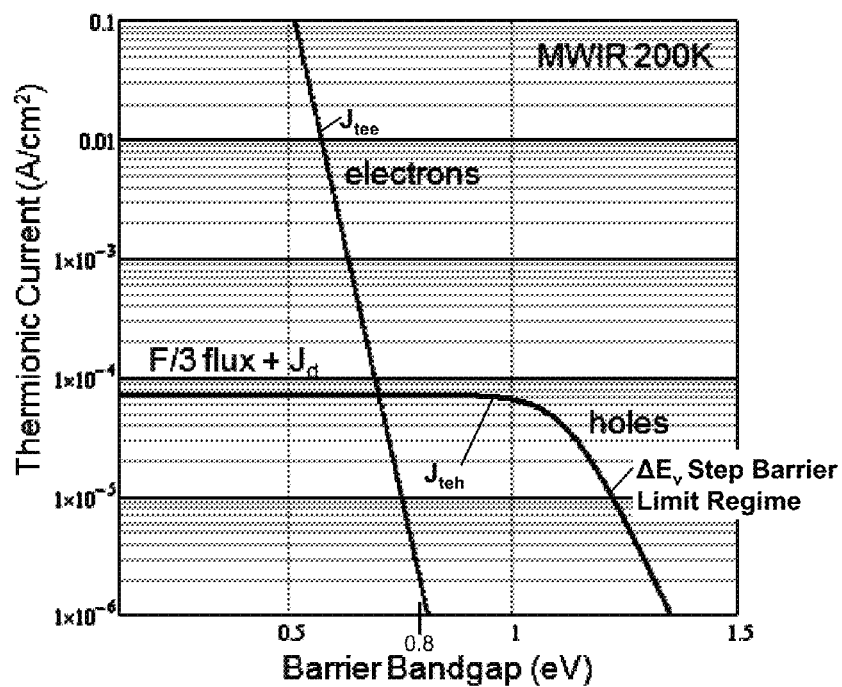
Figure 6A:
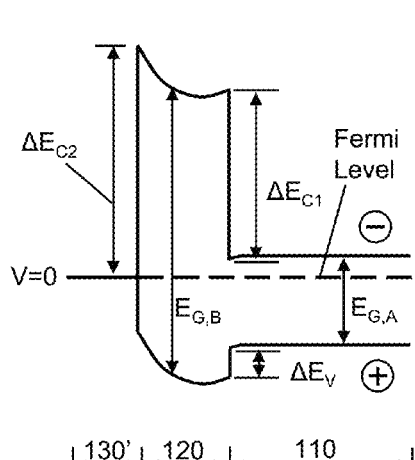
FIGS. 6A and 6B show band diagrams of another exemplary detector under no bias and under bias, respectively.
Figure 6B:
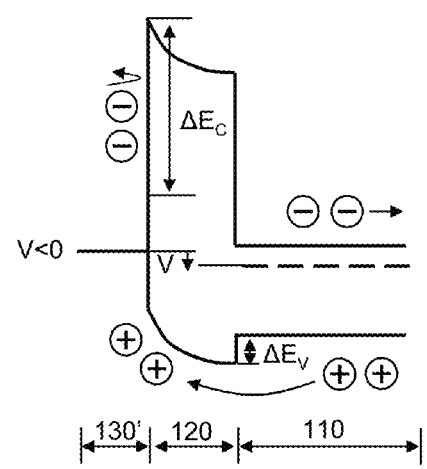

In the embodiments illustrated in FIGS. 2A, 2B, and 3, the bandgap energies of absorber layer 110 and collector layer 130 were the same ($E_{G,A}=E_{G,C}$). By decreasing the bandgap energy $E_{G,C}$ of collector layer 130 with respect to the bandgap energy $E_{G,A}$ of absorber layer 110 when the layers 110-130 are composed in the HgCdTe system, the magnitude of the electron emission current density $J_{tee}$ can be reduced relative to the hole emission current density $J_{teh}$. This configuration is illustrated in FIGS. 6A and 6B, which are band diagrams similar to those shown in FIGS. 2A and 2B, except that the collector layer, which is denoted as collector layer 130', comprises mercury telluride HgTe (a semi-metal) or a composition of $Hg_{1-x}Cd_xTe$ over the composition range of 0% to 13% in cadmium (mole fraction range: 0<x<0.13). In the latter composition range, the conduction band $Hg_{1-x}Cd_xTe$ merges with the valence band of the material, and the material has no bandgap and is essentially a semi-metal. The energy step for a electron moving from collector layer 130' to barrier layer 120 is denoted as $\Delta E_{C2}$, which is larger than the step energy $\Delta E_C$ shown in FIG. 2A, and is also larger than the step energy $\Delta E_{C1}$ shown in FIG. 6A for an electron transitioning between layers 110 and 120. Step energy $\Delta E_C$ shown in FIG. 2A has the same magnitude as step energy $\Delta E_{C1}$ shown in FIG. 6A. Step energy $\Delta E_{C2}$ is greater than step energy $\Delta E_C$ by a value of approximately $0.677 * E_{G,C}$ ($E_{G,C}$ of FIG. 2A), which is also equal to $0.677 * E_{G,A}$ ($E_{G,A}$ of FIG. 2A). This difference is equal to the difference in bandgap values between collector layers 130 and 130' (the difference being $E_{G,C}$ since the bandgap of layer 130' is zero), multiplied by the bandgap splitting ratio for the conduction band (0.677) described above.

While the barrier height energy ($\Delta E_{C2}$) for electron emission current density $J_{tee}$ from layer 130' to layer 120 is increased with this construction, the barrier height energy for hole emission current density $J_{teh}$ from layer 110 to layer 120 remains essentially the same at $\Delta E_V$. Because collector layer 130' has a higher electron affinity (work function) than collector layer 130, the energy level at the left side of barrier layer 120 is lowered below the energy level at the right side of layer 120 (as opposed to the construction shown in FIG. 2A where these energy levels were essentially the same). The lowered energy level reduces the electric field present at the right side of barrier layer 120, and consequently reduces the amount of electron accumulation at the interface between accumulation layer 110 and barrier layer 120. As a result, less applied voltage is needed to achieve the flat-band condition in absorber layer 110, and to support the hole current from absorber layer 110 to collector layer 130. A large difference in electron affinities between layers 130' and 110 can cause a depletion region to occur at the interface between layers 110 and 120 when no voltage is applied, or when a small negative voltage is applied. For some applications, as described below, the depletion region is acceptable, or even desirable. For other applications, the depletion region is not desirable, and can be eliminated by increasing the n-type dopant concentration in barrier layer 120.

Figure 7:
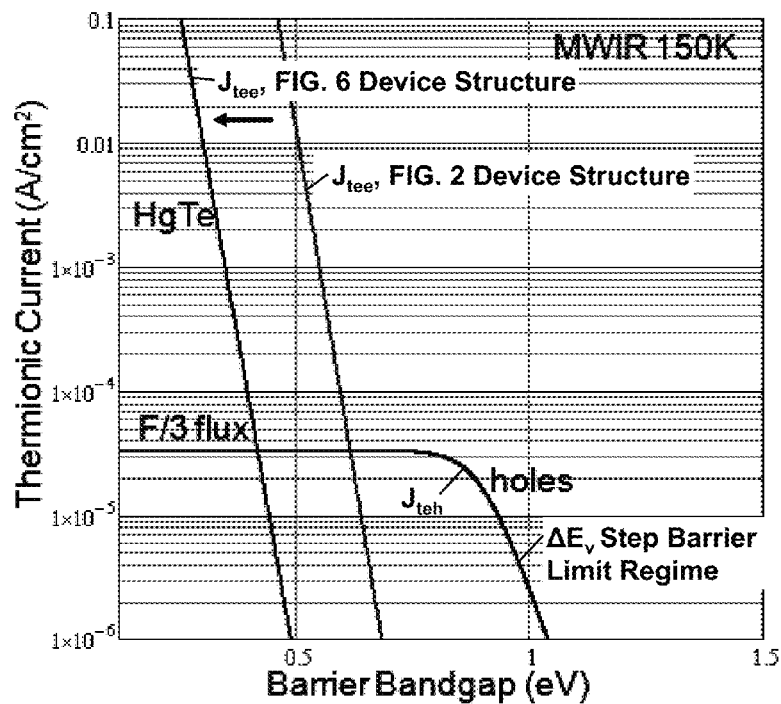
FIGS. 7 and 8 plot the electron and hole emission current densities in another exemplary MWIR detector according to the present invention as a function of bandgap energy value of the barrier layer at operating temperatures of 150° K and 200° K, respectively.
Figure 8:
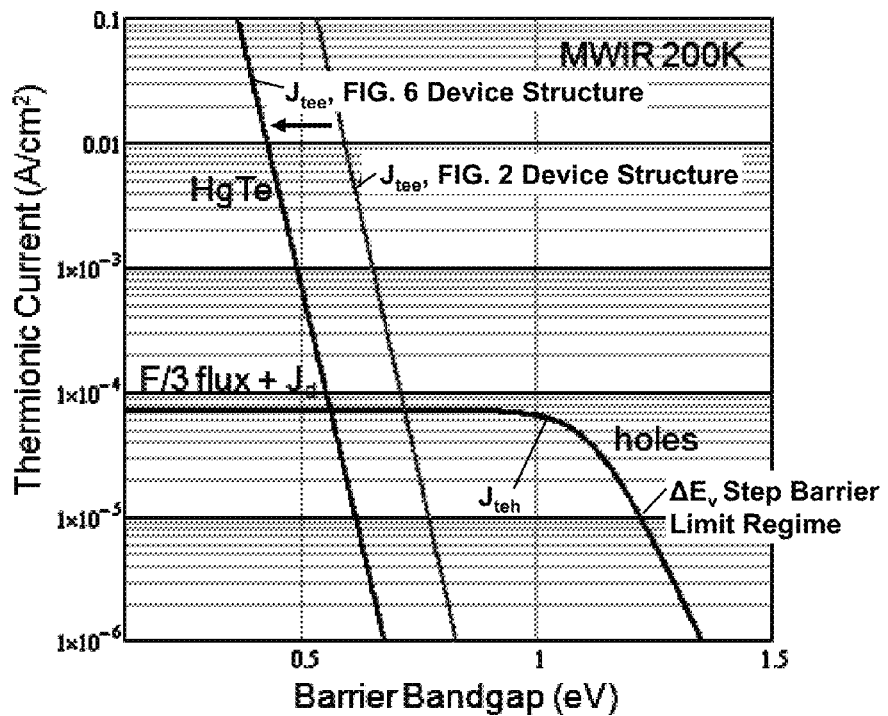

As indicated above, the step energy $\Delta E_{C2}$ in the detector shown in FIGS. 6A and 6B is greater than step energy $\Delta E_C$ in the detector 100 shown in FIGS. 2A and 2B by a value of approximately $0.677 * E_{G,C}$, which results in a reduction of the electron emission current density $J_{tee}$ from layer 130' to layer 120. As a modification of the embodiment shown in FIGS. 6A and 6B, the bandgap energy $E_{G,B}$ of the barrier layer 120 can be reduced by an amount of $E_{G,C}$ with respect to the bandgap energy $E_{G,B}$ of the barrier layer 120 of detector 100 shown in FIGS. 2A and 2B, which maintains substantially the same barrier to the flow of electron emission current density $J_{tee}$ from layer 130' to layer 120. As an advantageous effect, the reduction of the barrier bandgap energy $E_{G,B}$ reduces the step barrier for holes to a value of approximately ($\Delta E_V - 0.323 * E_{G,C}$). FIGS. 7 and 8 illustrate the effect of a HgTe collector layer on electron thermionic emission for MWIR HgCdTe nBn at 150° K and 200° K, respectively. These figures show the thermionic electron emission current densities $J_{tee}$ for each of the devices shown in FIGS. 2 and 6 respectively, as a function of barrier bandgap energy. As can be seen from the figures, the use of the HgTe collector layer 130' enables lower end of the useful range for barrier bandgap energies to be reduced by about 0.2 eV.

Figure 9:
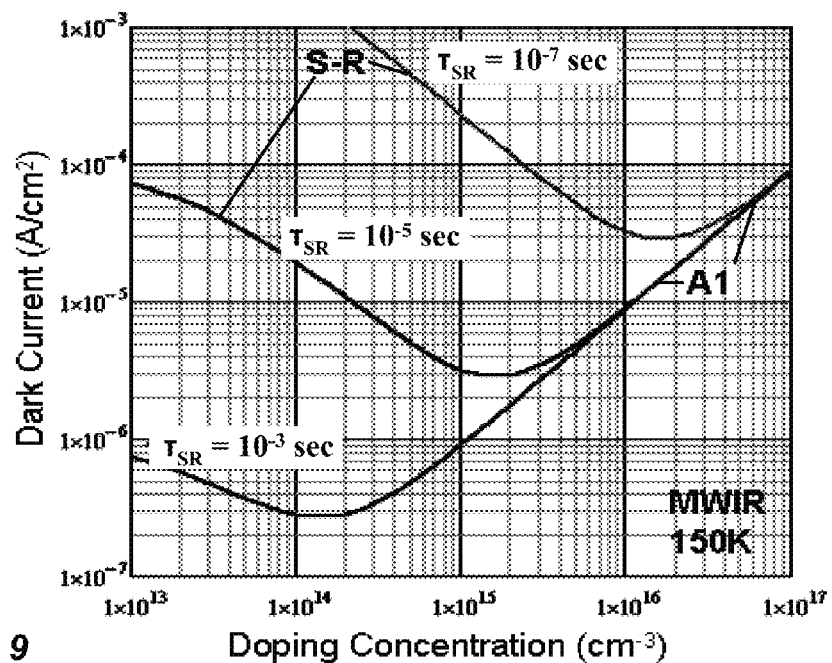
FIG. 9 shows the dark current density in an exemplary MWIR detector according to the present invention as a function of dopant concentration in the absorber layer at an operating temperature of 150° K.

There are a variety of mechanisms that occur in detector 100 that degrade the image signal generated by the device. Two prominent mechanisms occur in absorber layer 110 and generate parasitic currents in the device that are generically called "dark currents." The first such mechanism is due to the capture and emission of carriers at defect sites in the crystal, which is well described by the Shockley-Read theory. The second such mechanism is due to electron transitions from the valence band to the conduction band and is called Auger-1 generation. For the flat band condition in absorber layer 110 illustrated in FIGS. 2B and 6B, the dark current in the absorber volume is purely diffusion-limited since there is no significant electric field to induce drift currents. The dark current density $J_d$ is give by equation (4):

$$J_d = \frac{q n_i^2 t}{(N_d + n_i)\tau_{SR}} + \frac{q N_d t}{2 \tau_{Ai1}}, \qquad (4)$$

where the first term on the right-hand side of the equation is due to the Shockley-Read recombination mechanism, where the second term on the right-hand side is due to the Auger-1 mechanism, and where $N_d$ is the dopant concentration in absorber layer 110, t is the thickness of absorber layer 110, $\tau_{SR}$ is the minority carrier lifetime in absorber layer 110 for the Shockley-Read recombination mechanism, and $\tau_{Ai1}$ is the intrinsic minority carrier lifetime in absorber layer 110 for the Auger-1 mechanism without the presence of dopant in the layer (intrinsic semiconductor conditions). For operating temperatures where the dopant concentration $N_d$ is greater than the electron concentration $n_i$ in the intrinsic semiconductor, the Auger-1 term varies as $N_d$, whereas the S-R term varies as $1/N_d$. Hence, for any specific value of S-R lifetime $\tau_{SR}$, there will be a doping concentration that minimizes the diffusion current under the flat-band condition for absorber layer 110. This is illustrated in FIG. 9, which shows the dark current density $J_d$ for MWIR HgCdTe material at 150° K, as parameterized by various representative S-R lifetime values $\tau_{SR}$. S-R lifetime values due to intrinsic trap centers for HgCdTe material typically range from 100 μs to 1000 μs for MWIR material, and 10 μs to 100 μs for LWIR material. Referring to FIG. 9, a doping concentration that provides a minimum dark current density for MWIR material having an S-R lifetime $\tau_{SR}$=1000 μs is about $2 \times 10^{14}$/cm$^3$ at an operating temperature of 150° K. This provides a dark current density of about 0.3 uA/cm$^2$, which is much less than an optical system F/3 background flux current density of about 20 uA/cm$^2$ for this cutoff wavelength. More generally, minimum dark current under flat band conditions in the absorber is achieved by selecting the doping level $N_d$ to satisfy the condition $N_d^2 \tau_{SR} = 2 n_i^2 \tau_{Ai1}$. The minimum dark current under these conditions, using Equation (4), becomes $J_d = n_i q t (2/\tau_{SR} \tau_{Ai1})^{1/2}$, and varies as $(1/\tau_{SR})^{1/2}$. Thus the lowest dark current at any temperature is provided by absorber material with the longest S-R lifetime. As shown in FIG. 9, the regions around the minimum dark current points where $N_d^2 \tau_{SR} = 2 n_i^2 \tau_{Ai1}$ are rather broad, and thus implemented devices can have values of $N_d^2 \tau_{SR}$ that range between $0.25 * 2 n_i^2 \tau_{Ai1}$ and $4 * 2 n_i^2 \tau_{Ai1}$ and still have very low values of dark current, and can have values of $N_d^2 \tau_{SR}$ that range between $0.06 * 2 n_i^2 \tau_{Ai1}$ and $16 * 2 n_i^2 \tau_{Ai1}$ and still have low values of dark current. For MWIR HgCdTe material, a typical value for $2 n_i^2 \tau_{Ai1}$ is around $2 \times 10^{25}$ sec/cm$^6$.

The dark current density characteristics shown in FIG. 9 substantially prevail at the applied voltage that produces the flat band condition in absorber layer 110, and at applied voltages leading up to flat band condition. As the magnitude of the applied voltage is increased beyond the voltage needed to produce the flat band condition, a depletion region forms at the interface between absorber layer 110 and barrier layer 120. In the depletion region, the dynamics of the Shockley- Read recombination mechanism change, and the following additional term is added to the right-hand side of equation (3): $qn_i W_d/\tau_{SR}$, where $W_d$ is the width of the depletion region, which is dependent upon the magnitude of the applied voltage. The added term may be referred to as the "depletion S-R term," whereas the first term in equation (3) may be referred to as the "diffusion S-R term." For operating temperatures where the dopant concentration $N_d$ is greater than the electron concentration in the intrinsic semiconductor the diffusion S-R term in equation (3) reduces to $qn_i^2 t/(N_d \tau_{SR})$. For operating temperatures where $N_d > n_i$, it is generally advantageous to prevent a substantial depletion region from developing in absorber layer 110 since the depletion S-R term $qn_i W_d/\tau_{SR}$ is generally larger than the diffusion S-R term $qn_i^2 t/(N_d \tau_{SR})$ under this condition due to the fact that $n_i$ is larger than $n_i^2/N_d$ under this condition.

Figure 10:
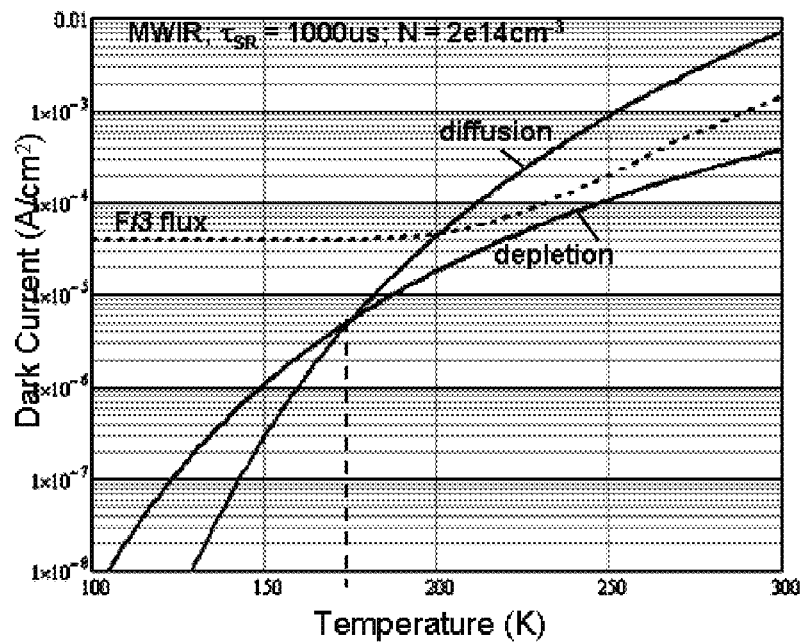
FIG. 10 shows the dark current density in an exemplary MWIR detector according to the present invention as a function of temperature under two different biasing modes.

The dependence of the dark current density on temperature for a 5 μm wavelength cutoff is shown in FIG. 10 for two cases. In the first case, which is indicated by the label "diffusion," the applied voltage is set so that conduction and valence bands of absorber layer 110 are at or near the flatband condition. In the second case, which is indicated by the label "depletion," the applied voltage is set so that a depletion region occupies substantially all of thickness of absorber layer 110 (which is typically about 3 μm). In both cases, an S-R lifetime $\tau_{SR}=10^{-3}$ seconds is assumed, and an absorber doping of $2\times10^{14}$/cm$^3$ is used. For comparison purposes a background flux current density for an F/3 optical system is included, shown by a dashed line and the label "F/3 flux." The flux current is minimal below 200° K, but increases at higher temperatures due to cold shield inefficiencies at higher temperatures associated with the contribution of background flux from the cold shield itself. Accordingly, the discussion of FIG. 10 will focus on operating temperatures that are around 200° K and below. From the figure, it is apparent that the diffusion curve is below the depletion curve for operating temperatures below about 170° K, and therefore biasing the device to achieve the flat-band condition in absorber layer 110 is best for temperatures below 170° K since this bias reduces the dark current the most. For operating temperatures above about 170° K, where $n_i > N_d$, the positions of the curves are switched, and the depletion curve is now below diffusion curve. In this case, biasing the device to achieve a depletion region in absorber layer 110 is generally best as this bias reduces the dark current the most. This depletion biasing substantially eliminates Auger-1 generation in absorber layer 110 by causing the substantial absence of majority carriers in the layer. It should be pointed out that depletion-mode operation of absorber layer 110 generally requires the applied reverse bias values to exceed the threshold Vbb described above, and hence increases the sensitivity of the detector 100 to excess current mechanisms such as tunneling. These excess currents can be minimized by selecting the dopant level $N_d$ and thickness t of absorber layer 110 to follow the following relationship with the bandgap energy value $E_{G,A}$ of absorber layer 110: $N_d \cdot t^2 \leq 2 \cdot \in_A \cdot \in_o \cdot E_{G,A}/q$, where $\in_o$ is the permitivity in vacuum (8.854×10$^{-14}$ F/cm), $\in_A$ is the relative permittivity of absorber layer 110 with respect to vacuum (generally ranging between 18 and 20), and q is the electron change (1.602×10$^{-19}$ C). For typical MWIR HgCdTe material, the quantity $2\cdot\in_A\cdot\in_o\cdot E_{G,A}/q$ is around $5.07\times10^6$ cm$^{-1}$. The above relationship is satisfied for a 3 μm thick absorber layer 110 with a n-type dopant level of around $5.6\times10^{13}$ cm$^{-3}$ or less, and for a 2 μm thick absorber layer 110 with a n-type dopant level of around $1.3\times10^{14}$ cm$^{-3}$ or less.

Layer 110 preferably has a sufficient thickness to absorb IR radiation and generate electron-hole pairs in substantial numbers. However, for diffusion-mode operation, the thickness should be kept small enough so that the holes generated at the bottom of absorber layer 110 can diffuse to the barrier layer 120 without being recombined by the S-R mechanism with electrons in substantial numbers. Thicknesses which provide a good balance of these mechanisms for mercury-cadmium telluride range from about 2 μm to about 5 μm, with a value of 3 μm+/−0.5 μm being an exemplary selection (e.g., 2.5 μm to 3.5 μm).

Figure 11:
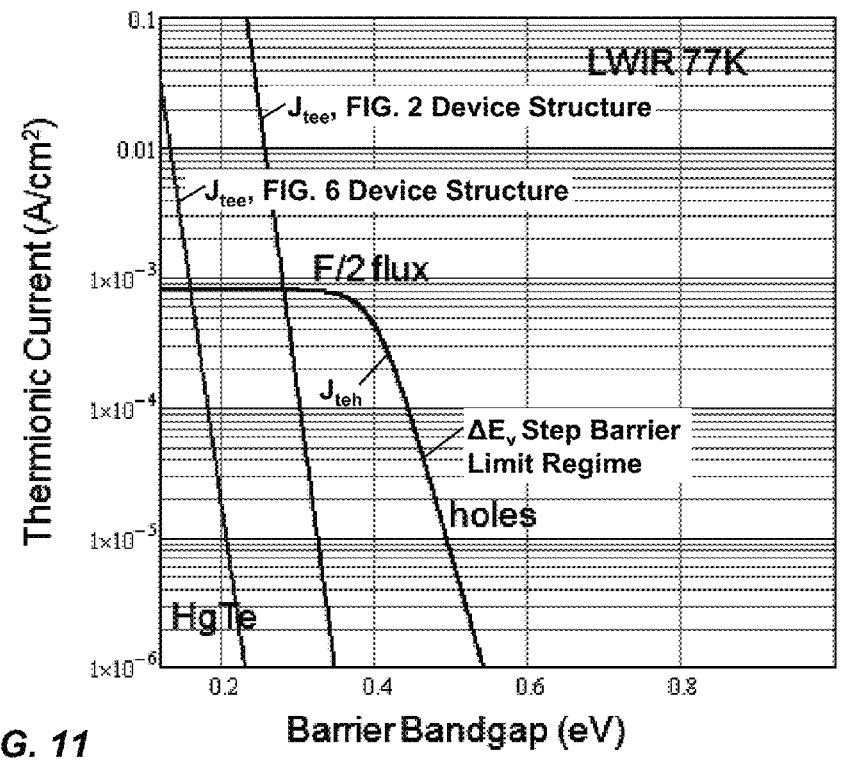
FIGS. 11 and 12 plot the electron and hole emission current densities in an exemplary LWIR detector according to the present invention as a function of bandgap energy value of the barrier layer at operating temperatures of 77° K and 120° K, respectively.
Figure 12:
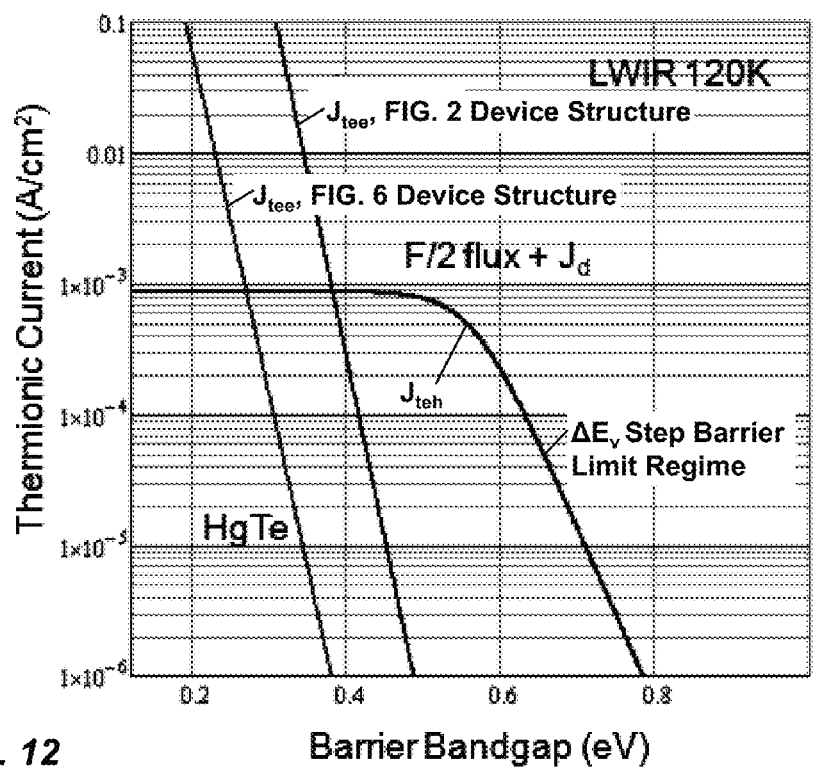

Thus far, detector 100 has been illustrated with MWIR implementations. Some exemplary LWIR implementations of detector 100 are described next (cadmium mole fraction in the range spanning from 0.203 to 0.234, with a corresponding bandgap energy value $E_{GA}$ ranging from 0.089 eV to 0.138 eV for 77° K). FIG. 11 shows the thermionic hole and electron emission current densities for an absorber layer with cutoff wavelength of 10 μm at temperature of 77° K (x=0.225, $E_{GA}$=0.124 eV), and FIG. 12 shows these current densities at a temperature of 120° K (x=0.225, $E_{GA}$=0.137 eV). An optical system F/2 background flux current density is assumed, and values of the electron current density for a HgTe collector are included. As can be seen in the figures, for the nBn structure that utilizes equal collector and absorber bandgaps (FIG. 2 Device Structure), it is difficult to select a bandgap value for the barrier layer 120 that satisfies the required thermionic hole and electron current conditions at both 77K and 120K. For example, a barrier bandgap of 0.35 eV provides a sufficiently large barrier to electron flow at 77K whilst allowing uninhibited hole flow, but not at 120K. However, the HgTe collector contact (FIG. 6 Device Structure) does allow the utilization of a single barrier bandgap of 0.3 eV to 0.35 eV, which provides an adequate barrier to electron current flow at both 77K and 120K, whilst at the same time ensuring that the hole emission current density $J_{teh}$ is limited by the full current from the absorber volume for both temperatures. For an absorber bandgap energy value $E_{G,A}$=0.124 eV (corresponding to a 10 μm cutoff wavelength), a barrier bandgap energy value in the range $E_{G,B}$=0.3 eV to 0.35 eV means that the $\Delta E_V$ step barrier will have a range of 0.057 eV t0 0.073 eV.

Figure 13:
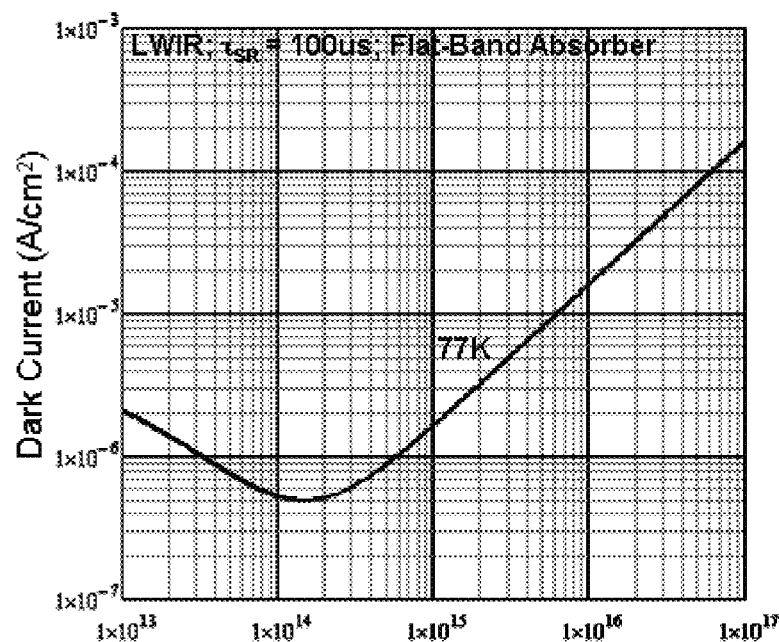
FIG. 13 shows the dark current density in an exemplary LWIR detector according to the present invention as a function of dopant concentration in the absorber layer at an operating temperature of 77° K.

The diffusion-limited dark current in a 10 μm cutoff flat-band absorber layer 110 is shown in FIG. 13 as a function of absorber doping concentration, at a temperature of 77° K. For a 100 us S-R lifetime the dark current is minimal for a doping concentration of $2\times10^{14}$ cm$^{-3}$. More generally, minimum dark current under flat band conditions in the absorber is achieved by selecting the doping level $N_d$ to satisfy the condition $N_d^2 \tau_{SR} = 2n_i^2 \tau_{Ai1}$. The dark current under these conditions, using Equation (4), becomes $J_d = n_i qt(2/(\tau_{SR}\tau_{Ai1})^{1/2})$, and varies as $(1/\tau_{SR})^{1/2}$. Thus the lowest dark current at any temperature is provided by absorber material with the longest S-R lifetime. As shown in FIG. 13, the region around the minimum dark current point where $N_d^2 \tau_{SR} = 2n_i^2 \tau_{Ai1}$ is moderately broad, and thus implemented devices can have values of $N_d^2 \tau_{SR}$ that range between $0.25*2n_i^2 \tau_{Ai1}$ and $4*2n_i^2 \tau_{Ai1}$ and still have low values of dark current, and can have values of $N_d^2 \tau_{SR}$ that range between $0.06*2n_i^2 \tau_{Ai1}$ and $16*2n_i^2 \tau_{Ai1}$ and still have acceptably low values of dark current. For LWIR HgCdTe material, a typical value for $2n_i^2 \tau_{Ai1}$ is around $2\times10^{24}$ sec/cm$^6$.

Figure 14:
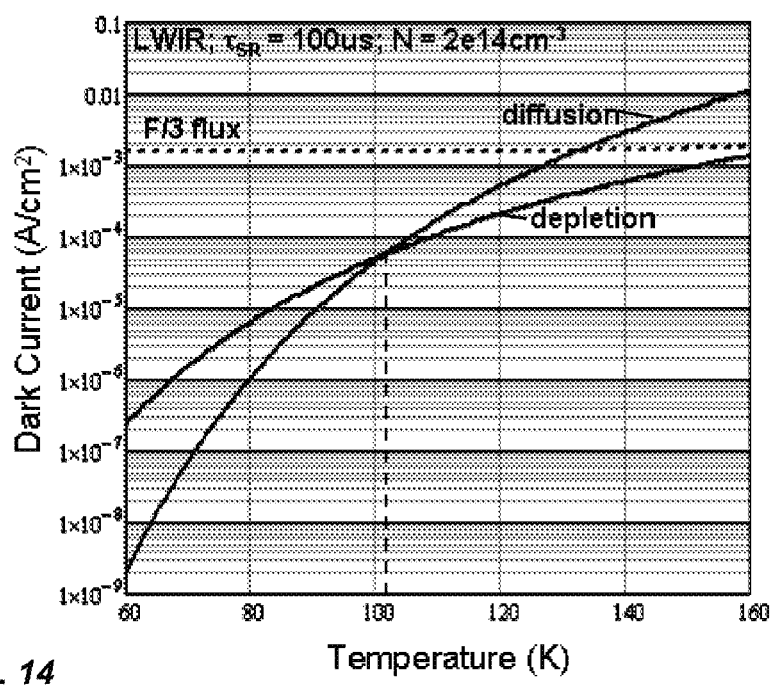
FIG. 14 shows the dark current density in an exemplary LWIR detector according to the present invention as a function of temperature under two different biasing modes.

The dependence of the dark current on temperature is shown in FIG. 14 for both the flat-band diffusion limited operation mode in absorber layer 110, and for the depletion operation mode in absorber layer 110. It is apparent that when the operating temperature is at or below about 105° K, the flat-band diffusion limited operation mode is best for limiting dark current. When the operating temperature is at or above about 105° K then the depletion operation mode is best for limiting dark current.

Figure 15A:
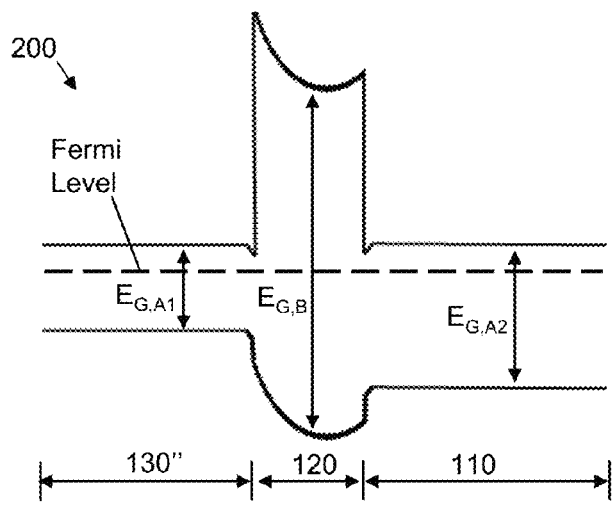
FIGS. 15A-15C show band diagrams of another exemplary detector under no bias, under negative bias, and under positive under bias, respectively.

Exemplary embodiments of the above-described LWIR and MWIR devices may be combined into a single device to provide a detector that can detect in two different IR bands dependent upon the polarity of the applied bias (a "dual color detector"). More specifically, the device structure shown in FIG. 2A is modified so that collector layer 130 becomes a second absorber layer 130" with a narrower band energy than absorber layer 110, as shown in FIG. 15A. Layer 130" has a more narrow bandgap so that the wider bandgap absorber is closer to the source of IR radiation than the narrower bandgap absorber. That way, the wider bandgap absorber allows transmission, and subsequent detection, of the narrow gap cutoff wavelength photons in the narrow gap absorber. The electron affinity at the two sides of the barrier will not be equal, unlike the cases considered above in FIG. 2, and electrons will flow to the narrower bandgap absorber region. For negligible donors in the barrier layer, a depletion region will form in the wide gap absorber, and an accumulation layer in the narrow gap absorber. The donor charge in this depletion region will be just that required to accommodate the difference in electron affinities of the wide and narrow gap absorber layers. If needed, this depletion region at the wide gap interface can be reduced or eliminated by placing donor charge in the barrier layer, thus providing accumulation layers at both the wide gap and narrow gap interfaces at zero bias.

Figure 15B:
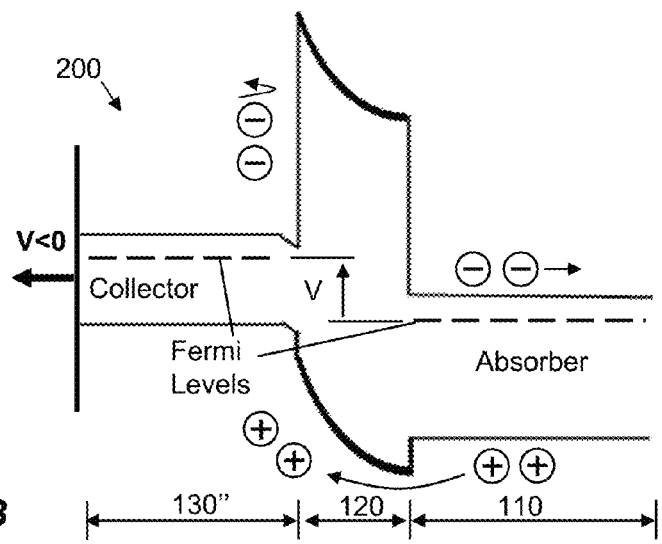
Figure 15C:
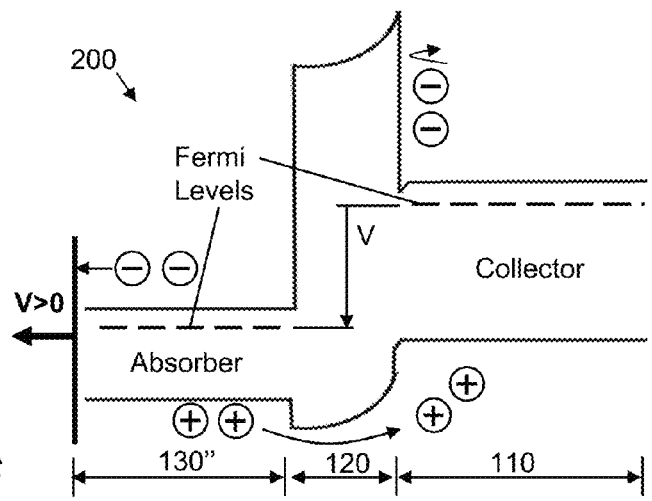

Depending upon applied bias, each of layers 110 and 130" acts as an absorber layer or a collector layer. FIG. 15B shows the band diagram when a negative voltage is applied, causing layer 110 to be the MWIR absorber layer, and layer 130" to be a collector layer. In this case, the detected current from the device is related to the received MWIR radiation. The hole barrier is due to the band offset between layer 110 and the barrier layer 120, and is relatively low. The electron barrier is due to the conduction band offset between the barrier and layer 130". FIG. 15C shows the band diagram when a positive voltage is applied, causing layer 130" to be the LWIR absorber layer, and layer 110 to be a collector layer. In this case, the detected current from the device is related to the received LWIR radiation. The hole barrier is due to the band offset between layer 130" and the barrier layer 120, and is relatively low. The electron barrier is due to the conduction band offset between the barrier and layer 110. The read-out chip may be designed to apply these different polarity voltages, and to detect the currents at different polarities. The parameters of the layers (e.g., doping levels, bandgaps, and thicknesses) may be selected to first provide the desired LWIR operational characteristics, since the collector in this case (layer 110) has the wider bandgap, which is less optimal for suppressing electron emission current. (The bandgap of layer 110 is, of course, set to achieve the desired MWIR reception band.) Then, the parameters may then be fine tuned to provide the desired MWIR operational characteristics. Typically, the operating temperature is around 100° K or below, and barrier bandgap energy is in a relatively narrow range around 0.6 eV for a system F/6 flux, a thickness of 1000 A and doping level of $1 \times 10^{16}$ cm$^{-3}$ for barrier layer 120, and a doping level of $2 \times 10^{14}$ cm$^{-3}$ for each of layers 110 and 130". In view of this disclosure, the selection and tuning of layer parameter values is within the ability of one of ordinary skill of the art and can be done without undue experimentation.

Figure 16:
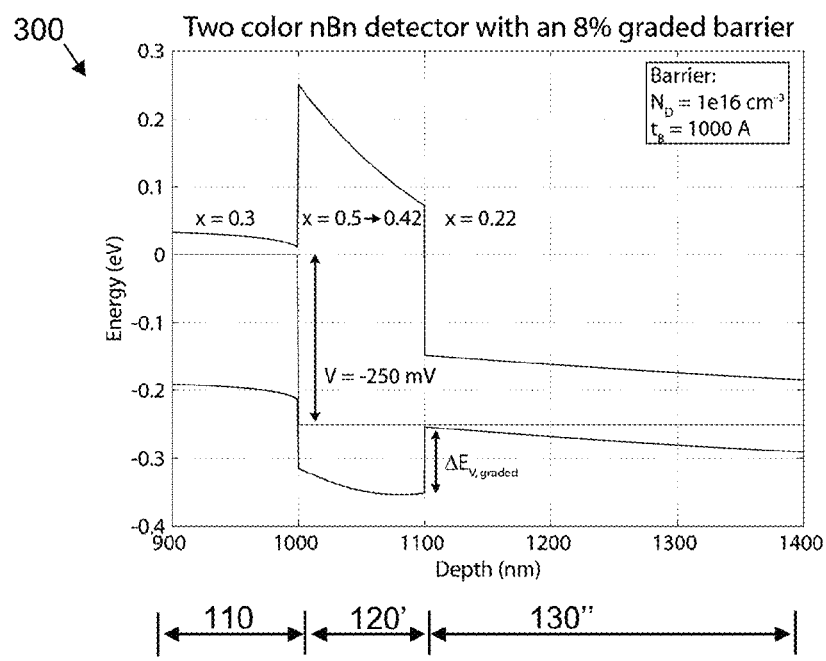
FIG. 16 shows a band diagram of another exemplary detector under bias.

Barrier layer 120 may comprise a graded cadmium (Cd) composition, which can enhance the operating characteristics of the dual color detector, and provide a wider range of operating temperature and wider ranges from which to select the layer parameters. FIG. 16 shows the band diagram of another exemplary embodiment 300 in which a barrier layer 120' is linearly graded in Cd starting with a Cd mole fraction of 0.50 (50%) at the interface with MWIR absorber layer 110 and ending with a Cd mole fraction of 0.42 (42%) at the interface with LWIR absorber layer 130", for a total of 8% in grading (8% grading). Compared to a device having a constant Cd mole fraction of 0.50, the graded barrier layer 120' has a smaller valence band offset between itself and the LWIR absorber region 130" under bias, thereby improving LWIR detection performance. The grading does create a quasi-electric field in the valence band that opposes hole current from the LWIR absorber layer 130" to layer 110. An applied bias will overcome the quasi-electric field, but results in a small depletion region in the LWIR absorber, which can increase dark currents. By using the graded barrier layer 120', the hole thermionic current can be increased for LWIR detection without significantly increasing electron thermionic current for MWIR detection. A barrier bandgap of 0.65 eV graded to 0.6 eV provides a larger ratio of thermionic hole current to electron current compared to a barrier with a uniform bandgap of 0.65 eV. The doping level in the barrier layer 120' can be set to be sufficiently large as to accommodate both the conduction band offset between the two absorber layers 110 and 130", and the accumulation region at the barrier-LWIR absorber interface that sets up a bias voltage for operation of the device that is larger than a few (kT/q). For a 1000 A barrier the doping for two-color operation at 77K is n-type $\sim 1 \times 10^{16}/$cm$^3$, with a barrier bandgap=0.6 eV. A low work function metal will suffice for the LWIR absorber contact, and a heavily doped N$^+$ layer for the MWIR contact.

Having described several detector embodiments of the present invention, exemplary methods of making these devices are described next with reference to FIG. 1. The above-described layers of the detectors may be formed directly on top of one another by molecular beam epitaxy (MBE), Metal-organic vapor phase epitaxy (MOVPE), or variations thereof, with the above-mentioned material compositions and n-type doping concentrations. Contact layer 5 may be so grown on substrate 1, either directly or with a buffer layer therebetween. Substrate 1 may comprise any of the materials mentioned above for it, including the non-conventional materials of silicon (Si), indium antimonide (InSb), gallium arsenide (GaAs), and germanium (Ge). With contact layer 5 formed, the exemplary methods further comprise forming absorber layer 110 as a first mercury-cadmium telluride layer directly on contact layer 5, the first mercury-cadmium telluride layer having a first major surface disposed directly on contact layer 5, and a second major surface parallel to its first major surface. Absorber layer 110 may be grown with a first bandgap energy value, and doped with an n-type dopant, as described above. The exemplary methods further comprise forming barrier layer 120 or 120' as a second mercury-cadmium telluride layer directly on the first mercury-cadmium telluride layer (absorber layer 110), the second mercury-cadmium telluride layer having a first major surface disposed directly on the second major surface of the first mercury-cadmium telluride layer, and a second major surface parallel to its first major surface. Barrier layer 120 or 120' may be grown with a first bandgap energy value, and doped with an n-type dopant, as described above. The exemplary methods further comprise forming a collector layer 130, 130' or 130" directly on the second mercury-cadmium telluride layer, the collector layer having a first major surface disposed on the second major surface of the second mercury-cadmium telluride layer (barrier layer 120 or 120'), and a second major surface parallel to its first major surface. Collector layer 130, 130' or 130" may be grown with a material composition described above.

The exemplary methods may then form one or more top metallization layers for top collector pad 140, followed by forming a patterned etch mask over the metallization layer and removing the metallization layer(s) from the locations between the detectors 100, and from the location for bottom conductive pad 6. Then, the patterned etch mask may be retained, or removed and replaced by another etch mask, either of which covers portions where detectors 100 and conductive pad 6 are to be defined. The methods may further comprise conventional HgCdTe wet etching, HgCdTe dry etching, or a combination of both, to remove the unmasked portions of layers 110, 120, 120', 130, 130', and 130", reaching down to contact layer 5, to define the detectors 100 with sidewalls. (However, a functional array can be obtained by not etching away the unmasked portions of absorber layer 110, or by partially etching the unmasked portions of layer 110.) Then, an electrically-insulating passivation layer 8 may be formed on the sidewalls of the defined detectors 100, such as by thermal oxidation (e.g., low-temperature or room-temperature oxidation in an oxygen-containing gas) to form a native oxide over the sidewalls, or by anodic oxidation, or by chemical oxidation, or by vapor deposition of materials known to be insulating, such as CdTe or ZnS. Before this passivation process, one or more cleaning steps may be performed to remove etching byproducts, and the patterned mask layer may be removed if a high temperature thermal oxidation step is going to be used to form the passivation layer and the mask cannot withstand the high temperature. Otherwise, the mask may be removed after the oxidation.

The passivation/oxidation process can leave a passivation/oxide layer over the area where contact pad 6 is to be formed. A simple process may be used to remove this layer and form contact pad 6. The passivation/oxide layer can be removed by disposing a photoresist over the wafer, pattern exposing the photoresist and developing it to remove portions of the resist over the location for contact pad 6. Then, the passivation/oxide layer over the area for contact pad 6 can be removed by conventional HgCdTe processing etchants. After which, contact pad 6 can be formed by forming a metallization layer over the area for contact pad 6. Instead, a more complex method may be used. In this process, a layer of a suitable dielectric material is formed over the wafer surface after the above-described passivation process. A photoresist is thereafter formed over the dielectric layer, and pattern exposed and developed to remove portions of the photoresist that lie over the locations for contact pad 6 and collector pads 140. The exposed portions of the dielectric layer are etched away, as well as the passivation/oxide layer over the area of contact pad 6. Then, one or more metallization layers may be formed over the exposed area for contact pad 6 and collector pads 140. The photoresist layer may then be removed, taking with it the unwanted metal layer (e.g., metal lift-off process).

It should be understood that where the performance of an action of any of the methods disclosed above and claimed herein is not predicated on the completion of another action, the actions may be performed in any time sequence (e.g., time order) with respect to one another, including simultaneous performance and interleaved performance of various actions. (Interleaved performance may, for example, occur when parts of two or more actions are performed in a mixed fashion.) Accordingly, it may be appreciated that, while the method claims of the present application recite sets of actions, the method claims are not necessarily limited to the order of the actions listed in the claim language, but instead cover all of the above possible orderings, including simultaneous and interleaving performance of actions and other possible orderings not explicitly described above, unless otherwise specified by the claim language (such as by explicitly stating that one action precedes or follows another action).

Any recitation of "a", "an", and "the" is intended to mean one or more unless specifically indicated to the contrary.

The terms and expressions which have been employed herein are used as terms of description and not of limitation, and there is no intention in the use of such terms and expressions of excluding equivalents of the features shown and described, it being recognized that various modifications are possible within the scope of the claims.

Moreover, one or more features of one or more embodiments may be combined with one or more features of other embodiments without departing from the scope of the present subject matter.

While the present subject matter has been particularly described with respect to the illustrated embodiments, it will be appreciated that various alterations, modifications, adaptations, and equivalent arrangements may be made based on the present disclosure (e.g., various changes may be made and equivalents may be substituted for elements thereof to adapt to particular situations), and are intended to be within the scope of the present subject matter and the appended claims.

What is claimed is:

1. A method of making an infrared detector, the method comprising:
    forming a bottom contact layer on a substrate;
    forming a first mercury-cadmium telluride layer on the bottom contact layer, the first mercury-cadmium telluride layer having a first major surface disposed on the bottom contact layer, a second major surface parallel to the first major surface, and a first bandgap energy value, the first mercury-cadmium telluride layer being doped with an n-type dopant;
    forming a second mercury-cadmium telluride layer on the first mercury-cadmium telluride layer, the second mercury-cadmium telluride layer having a first major surface disposed on the second major surface of the first mercury-cadmium telluride layer, a second major surface parallel to the first major surface of the second mercury-cadmium telluride layer, and a second bandgap energy value that is greater than the first bandgap energy value, the second mercury-cadmium telluride layer being doped with an n-type dopant; and
    forming a collector layer on the second mercury-cadmium telluride layer, the collector layer having a first major surface disposed on the second major surface of the second mercury-cadmium telluride layer, and a second major surface parallel to the first major surface of the collector layer, wherein the collector layer comprises a third mercury-cadmium telluride layer having a third bandgap energy value that is less than the first bandgap energy value of the first mercury-cadmium telluride layer.

2. The method of claim 1, further comprising pattern etching portions of at least the collector layer and second mercury-cadmium telluride layer to define two or more detector elements with side walls.

3. The method of claim 2, wherein pattern etching further etches at least a portion of the first mercury-cadmium telluride layer.

4. The method of claim 2, further comprising forming a passivation layer on the side walls.

5. The method of claim 4, wherein forming a passivation layer comprises oxidizing the side walls.

6. The method of claim 1, further comprising forming a top collector pad on the second major surface of the collector layer, the top collector pad comprising one or more metallization layers.

7. The method of claim 1, further comprising forming a bottom conductive pad on the bottom contact layer, the bottom conductive pad comprising one or more metallization layers.

8. The method of claim 1, wherein the third mercury-cadmium telluride layer has a cadmium mole faction with respect to mercury that is equal to or less than 0.13.

9. The method of claim 1, wherein the substrate comprises at least one of the following materials: silicon, InSb, GaAs, or Ge.

10. The method of claim 1, wherein the first mercury-cadmium telluride layer is characterized by a surface area and comprises a concentration of crystal defects equal to or greater than $1 \times 10^6$ defects per square centimeter of the surface area.

11. The method of claim 1, wherein the concentration of the n-type dopant within the first mercury-cadmium telluride layer is at or below a concentration level of $5 \times 10^{15}$ dopant atoms per cubic centimeter.

12. The method of claim 1, wherein the first mercury-cadmium telluride layer has a bandgap energy value in the range of 0.24 eV to 0.27 eV and a Shockley-Read minority carrier lifetime that is equal to or greater than 100 μs.

13. The method of claim 1, wherein the first mercury-cadmium telluride layer has a bandgap energy value in the range of 0.19 eV to 0.22 eV and a Shockley-Read minority carrier lifetime that is equal to or greater than 10 μs.

14. The method of claim 1, wherein the first mercury-cadmium telluride layer has a first n-type dopant level, a first thickness, and a bandgap energy value $E_{G,A}$, wherein the quantity formed by the square of the first thickness multiplied by the first n-type dopant level is equal to or less than the quantity $2 \cdot \in_A {}^* \in_o \cdot E_{G,A}/q$, where $\in_o$ is the permitivity in vacuum, $\in_A$ is the relative permittivity of the first mercury-cadmium telluride layer with respect to vacuum, and q is the electron charge.

15. The method of claim 1, wherein the second mercury-cadmium telluride layer further comprises a graded composition of cadmium that causes the second bandgap energy to have values that vary along a dimension spanning between the first and second major surfaces of the second mercury-cadmium telluride layer.

* * * * *